United States Patent [19]
Heitmann et al.

[11] Patent Number: 4,578,651
[45] Date of Patent: Mar. 25, 1986

[54] MAGNETOOPTICAL MODULATOR

[75] Inventors: Heinrich Heitmann, Rellingen; Wolfgang Tolksdorf, Tornesch; Fritz Welz, Rosengarten; Klaus Witter, Hamburg, all of Fed. Rep. of Germany

[73] Assignee: U.S. Philips Corporation, New York, N.Y.

[21] Appl. No.: 427,058

[22] Filed: Sep. 29, 1982

[30] Foreign Application Priority Data

Oct. 3, 1981 [DE] Fed. Rep. of Germany ....... 3139487

[51] Int. Cl.⁴ ................ H01S 3/00; G11C 13/06; G02F 1/09
[52] U.S. Cl. .................... 332/7.51; 365/19; 365/122; 350/375; 350/377
[58] Field of Search ............ 350/375, 376, 377, 378, 350/DIG. 1, DIG. 3; 332/7.51; 365/3, 13, 19, 122

[56] References Cited

U.S. PATENT DOCUMENTS

| | | | |
|---|---|---|---|
| Re. 29,530 | 1/1978 | Krumme et al. | 365/112 |
| 3,808,068 | 4/1974 | Johnson et al. | 156/8 |
| 4,218,762 | 8/1980 | Haisma et al. | 365/3 |
| 4,229,805 | 10/1980 | Breed | 365/19 |
| 4,274,935 | 6/1981 | Schmelzer et al. | 204/192 |
| 4,314,894 | 2/1982 | Schmelzer et al. | 204/192 |

FOREIGN PATENT DOCUMENTS

| | | | |
|---|---|---|---|
| 0076544 | 9/1982 | European Pat. Off. | 350/375 |
| 0445590 | 11/1981 | Japan | 365/122 |

OTHER PUBLICATIONS

Krumme et al., "MOPS a Magneto . . . Storage", 1/77, pp. 366–368, Jour. Appl. Phys., vol. 48, #1.
Chang et al., "Magnetic Bubble . . . Device", 10/70, pp. 1187–1188, IBM Tech. Disc. Bull., vol. 13, #5.
Hansen et al., "Optical Switching . . . Garnets", 1/84, pp. 33–45, Phillips Tech. Rev., vol. 41, #2.

Primary Examiner—Nelson Moskowitz
Attorney, Agent, or Firm—Marc D. Schechter

[57] ABSTRACT

In a magnetic layer of a magnetooptical modulator having fixed magnetic single domain areas, the areas of the layer present between the single domain areas are made electrically conductive by reduction.

12 Claims, 6 Drawing Figures

MAGNETOOPTICAL MODULATOR

BACKGROUND OF THE INVENTION

The invention relates to a magnetooptical modulator having a layer of a magnetic material on a substrate. The magnetic material has an easy axis of magnetization perpendicular to the plane of the layer. The layer has a number of magnetic domain areas separated from each other by intermediate areas.

The invention furthermore relates to a method of manufacturing such a magnetooptical modulator.

Such magnetooptical modulators can be used in digital optical memories, in display screens and in optical printers. Such a magnetooptical modulator is described in DE-OS 2732282 (corresponding to U.S. Pat. Nos. 4,274,935 and 4,314,894). A plurality of magnetic domains and single domain islands, respectively, are formed in the layer of magnetic material. The magnetization of each domain can be in one of two stable directions perpendicular to the surface of the layer. The direction of magnetization of a domain corresponds to information according to a selected convention. For example, one direction of magnetization corresponds to a binary "zero" and the other direction of magnetization corresponds to a binary "one", or conversely. The directions of the domains can be observed as a light-dark distribution by exposure to polarized light, due to the magnetooptical Faraday effect.

Information can be written into the magnetic layer by applying an external magnetic field according to the desired direction of magnetization for a short period of time and at the same time applying a thermal pulse to the region of the layer to be written in. In fact, only small external magnetic fields are necessary at higher temperatures for swtiching the direction of magnetization of a domain.

Depending on the use of the magnetooptical modulator, the thermal pulse may be generated in various manners. When used as a memory, a laser beam is focused on a domain. The domain is heated by the absorbed light energy. When used purely as a light modulator, each domain is covered with a thin-film resistor which is connected electrically to crossing conductor paths. The thermal pulse can also be generated by a combination of a laser and a resistor.

Since the information content of the layer is associated with the arrangement of the magnetic areas (domains or single domain areas), the locations and the sizes of the areas must be accurately fixed. This is also necessary to reproducibly read the information. In order to obtain a large information density, the surface of the area must be as small as possible. The minimum size and the maximum density of the areas are restricted by the smallest diameter of the light spot on which the light beam can be focused on the layer, as well as by the accuracy of the deflection.

It is known that in spontaneously magnetized layers, the directions of magnetization of magnetic domains are opposite to that of adjoining domains. Adjacent domains are separated from each other by a magnetic wall. However, in the layers which are used for magnetooptical modulators and which must be switchable by means of small magnetic fields, the domains are often too large and in certain circumstances can too easily be shifted. Hence, they must be made smaller and stable as regards location by additional measures.

Fixing the magnetic single domain areas in the layer is described in DE-OS 2732282. In this publication is intermediate areas are produced by exposure to highly energetic ions or by ion implantation and an optional subsequent etching of core tracks. At the locations of these intermediate areas, there is large gradient in the magnetic properties of the layer. The intermediate areas form the walls of the single domain areas. As a result of the exposure to ions, fine structures can be obtained so that a high information density can be achieved. Moreover, the smooth surface of the magnetic layers is maintained.

SUMMARY OF THE INVENTION

It is an object of the invention to provide a magnetooptical modulator in which electronic elements provided on the magnetic layer are connected along the domain boundaries.

According to the invention, the intermediate areas (boundaries) are at least partly electrically conductive.

The invention is based on the discovery of the fact that it is possible, by heating the magnetic material in a reducing atmosphere, to convert the areas present between the single domain areas to obtain not only a high threshold for movement of the magnetic walls, but to increase the electrical conductivity of the intermediate areas.

In a first embodiment of a magnetooptical modulator according to the invention, a first and a second system of crossing conductor paths insulated electrically with respect to the intermediate areas are provided on the layer. The conductor paths are insulated electrically from each other at the crossings. A resistive layer, connected to a conductor path of the first system and to a conductor path of the second system, is provided at each domain area.

If the intermediate areas are completely electrically conductive, they have a comparatively high threshold for the movement of magnetic walls. This means that the formed single domain areas are stable with respect to their location. The lattice of intermediate areas, in fact does not allow movement of magnetic walls. Another advantage is that such intermediate areas absorb light to reduce crosstalk in the magnetic memory layer.

In a second embodiment of a magnetooptical modulator according to the invention, the electrically conductive intermediate areas form a first system of electrical conductor paths. A second system of electrical conductor paths is provided on the surface of the layer. The conductor paths of the second system are insulated electrically with respect to the conductor paths of the first system and cross the conductor paths of the first system. A resistive layer, which is connected to a conductor path of the first system and to a conductor path of the second system, is provided at each domain area.

Since parts of the intermediate areas are converted into conductive areas, these parts can take over the function of the conductor paths. Moreover, it is possible to convert thin layers at the surface into electrical insulators. As a result, a system of conductor paths can be vapor-deposited on a smooth surface of the magnetic layer and the system can be electrically insulated with respect to the system of conductor paths in the layer.

In a third embodiment of the invention the electrically conductive parts of the intermediate areas form a first system of conductor paths and a second system of conductor paths. The conductor paths of the second system are insulated electrically with respect to the conductor paths of the first system and cross the conductor paths of the first system. A resistive layer, which is connected to a conductor path of the first system and to a conductor path of the second system, is provided at each domain area.

Since conductive areas can be converted into insulating areas, and conversely, it is possible to simply form mutually insulated systems of conductor paths in the layer.

In a further embodiment of the invention, the layer of magnetic material is a ferrimagnetic garnet layer. In particular, the layer has the composition (Gd, Bi, Pb)$_3$(Fe, Al, Ga, Pt)$_5$O$_{12}$.

In a favorable embodiment, the garnet layer has the composition Gd$_{2.62}$Bi$_{0.35}$Pb$_{0.03}$Fe$_{4.70}$Ga$_{0.27}$Pt$_{0.03}$O$_{12}$.

A magnetooptical modulator according to the invention can be manufactured by reducing the intermediate areas. As a result of the reduction, conductive intermediate areas are produced which accurately fix the single domain areas. In preparation for the reduction step, the memory layer can be pretreated in various manners.

According to a first embodiment of the method, the layer is covered, before the reduction process, by a mask, in particular a quartz layer, in such manner that the intermediate areas are not covered. The reduction process is then carried out.

This method may be used when the width of the intermediate areas in the layer is not critical, i.e. when very accurately defined intermediate areas are not required. The duration and temperature of the reduction process must be chosen that the reduced zone penetrates the entire thickness of the layer. This method is suitable in particular when the widths of the intermediate areas are large as compared with the layer thickness.

According to a further favorable embodiment of the method, the whole layer is exposed to at least 10$^6$ ions/cm$^2$. The ions used have such a mass and energy that the average depth of penetration is larger than the layer thickness. The ions produce etchable core tracks in the layer. The layer is then covered with an etching mask which does not cover the intermediate areas. The core tracks are then etched, and the mask layer is subjected to the reduction process.

According to particular embodiments of this method for preparing the layer prior to the reduction process, a structured quartz layer is used as an etching mask. The core tracks are etched chemically.

This process step is suitable in particular for thicker magnetic layers, for example for layers having a thicknesses in the range from more than 2 $\mu$m to 30 $\mu$m. This process step also suitable in particular when single domain areas are to be formed which have a small areas with respect to their heights (the height corresponds to the thickness of the layer). Very accurately defined reduced areas are formed so that very accurately defined single domain areas can be obtained.

The highly energetic ions leave core tracks in the magnetic layer having high defect densities and diameters of approximately 10 nm. The core tracks can be removed by selective etchants so that channels having cylindrical or conical cross-sections are formed. The nonetched core tracks remain substantially inoperative magnetically because their diameters (approximately 10 nm) are considerably smaller than the thicknesses of the magnetic walls (approximately 100 nm). For this reason, the exposure of the magnetic layer to highly energetic heavy ions can be carried out without a mask.

According to another favorable embodiment of the method, the layer is covered with an ion-absorbing mask. The mask is made of an element having a high atomic weight. The intermediate areas are not covered by the mask. Ions are implanted in the intermediate areas of the layer with such an ion density that a sufficiently large disturbance of the crystal lattice is obtained. The absorbing layer is then removed, and the magnetic layer is subsequently subjected to the reduction process.

According to particular embodiments of this method, the ions are accelerated to such an energy that their average depth of penetration is at least 1/5 and at most 4/5 of the thickness of the memory layer. The thickness of the memory layer is preferably below 2 $\mu$m.

The absorbing layer may be a gold layer in which windows are formed by photoetching. The thickness of the gold layer exceeds the depth of penetration into the absorbing layer of the ions used.

The temperature of the reduction process must be adapted to the growth conditions as well as to the composition of the magnetic layer. At a suitably chosen temperature, the reduction occurs selectively in the area implanted with ions. The nonimplanted area is only slightly reduced.

This method can advantageously be used with layers having thicknesses up to approximately 2 $\mu$m and provides very accurately defined single domain areas.

The reduction process is preferably carried out in an N$_2$/H$_2$ atmosphere with 90% N$_2$ + 10% H$_2$, at temperatures in the range from 350° to 600° C. for 0.5 to 24 hours. It may also be advantageous to selectively oxidize portions of the reduced areas of the layer by tempering for approximately 24 hours in oxygen at a temperature of approximately 900° C. By the choice of a suitable temperature and duration, thin layers at the surface can be converted again partly into the strongly electrically insulating state. As a result a system of insulated conductor paths in the layer can be simply formed.

FIG. 1b is a sectional view taken on the line Ib—Ib of FIG. 1a.

FIG. 2b is a sectional view taken on the line II—IIb of FIG. 2a.

FIG. 3b is a sectional view taken on the line IIIb—IIIb of FIG. 3a.

DESCRIPTION OF THE PREFERRED EMBODIMENTS

Figure 1A:
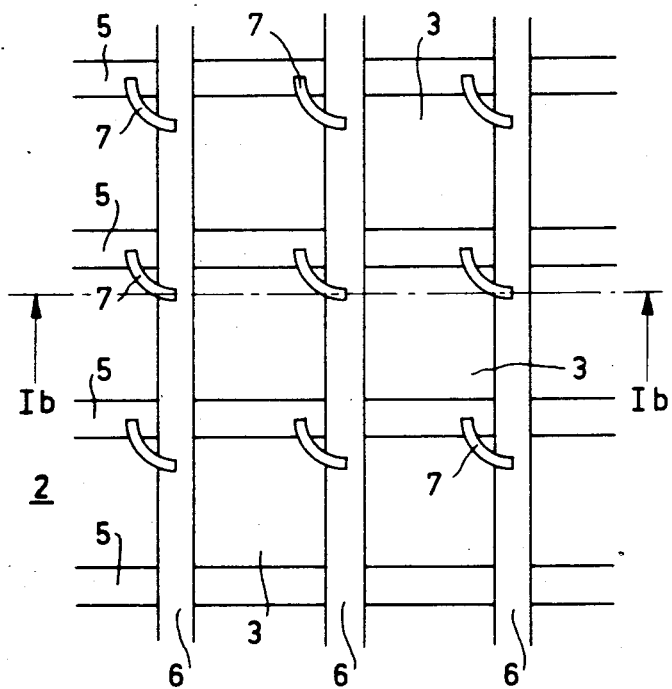
FIG. 1a is a top plan view of a first embodiment of a magnetooptical modulator.
Figure 1B:
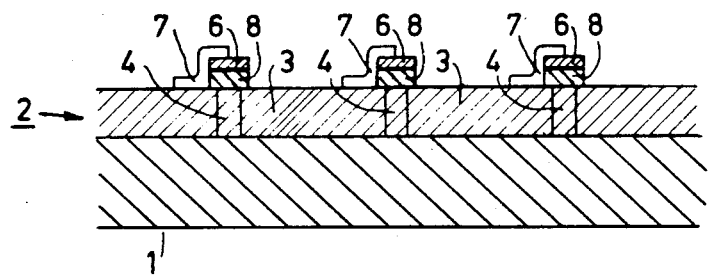

FIGS. 1a and 1b show a first embodiment of a magnetooptical modulator. The modulator has a substrate 1 on which a ferrimagnetic garnet layer 2 is provided. A plurality of single domain areas 3 separated from each other by conductive intermediate areas 4 are formed in the garnet layer 2. The conductive intermediate areas 4 are coated with an insulating layer 8.

A first system of conductor paths 5 and a second system of conductor paths 6 are provided on the layer 8. The conductor paths 5 and 6 are insulated from each other at the crossings. A thin-film resistive layer 7 is provided on each single domain area 3 and is connected to a conductor path 5 and to a conductor path 6. By applying voltage pulses to a conductor path 5 and to a conductor path 6 the resistive layer 7 at the crossing and hence the associated domain area 3 are heated. By simultaneous application of an extra magnetic field the direction of magnetization of the domain area in question can be reversed.

The production of the conductive intermediate area 4 in the layer 2 will be described in greater detail with reference to the following Examples.

EXAMPLE 1

When small tolerances are required as regards the widths of the intermediate areas 4 of the magnetic layer 2, of the intermediate areas 4 can be carried reduced directly without first exposing these areas to highly energetic ions. In one embodiment the following method was used.

A 3 $\mu$m thick ferrimagnetic garnet layer 2, grown epitaxially on a monocrystalline substrate disk 1 and having the composition $Gd_{2.62}Bi_{0.35}Pb_{0.03}Fe_{4.70}Ga_{0.27}Pt_{0.03}O_{12}$, was covered by a chemical transport reaction with a 100 nm thick $SiO_2$ layer. A mask consisting of 17 micron square quartz islands and intermediate areas having widths of 3 $\mu$m was then etched in the quartz layer via a photolacquer mask with a buffered HF solution. The garnet layer 2 was then transferred to a furnace containing 90% $N_2$ + 10% $H_2$ for one hour at 500° C.

As a result of this reducing treatment, strongly absorbing electrically conductive intermediate areas having sheet resistances $R_F = 100\Omega$ were formed in the garnet layer 2 in the places not covered by the quartz mask. Due to diffusion, the intermediate areas extended approximately 1.5 $\mu$m below the quartz coating, so that transparent square single domain areas 3 each had dimensions of 14 $\mu$m × 14 $\mu$m.

EXAMPLE 2

With layers having thicknesses up to approximately 30 $\mu$m, very good tolerances of the single domain areas 3 can be obtained when the layer 2 is exposed to at least $10^6$ ions/cm$^2$ prior to the reducing treatment. In one embodiment, a 3 $\mu$m thick layer 2 of ferrimagnetic garnet material was exposed to approximately $10^9$ xenon ions/cm$^2$ with a specific energy of 6 meV/nucleon. After exposure the layer 2 was covered by a chemical transport reaction with a quartz layer which formed a mask. For providing the quartz layer, any method known to those skilled in the art may be used, for example a plasma activated chemical transport reaction.

The $SiO_2$ layer was provided with the desired mask structure in such manner that the single domain areas 3 to be generated in the layer 2 were covered by the mask, and the exposed areas of the garnet layer 2 between the single domain areas 3 to be formed were exposed. Windows were formed in the quartz layer by photoetching.

The layer 2 thus masked was then subjected to an etching treatment to etch the core tracks. Selective etching solutions, for example 70 vol.% $H_2O$ + 30 vol.% $H_3PO_4$ at a temperature of 60° C., were found. With such an etchant, the crystal element disturbed by the ion-exposure etches much faster than the undisturbed crystal element. When etching with the above described $H_2O/H_3PO_4$ etching solution, channels are formed at the core tracks of approximately 18 nm diameter within approximately 10 minutes.

The layer 2 with enlarged core tracks in the intermediate areas 4 and with domain areas 3 still masked, was then subjected to a reduction treatment in an $N_2/H_2$ atmosphere with 90% $N_2$ + 10% $H_2$ at a temperature of 450° C. for 1 hour.

In this manner very accurately defined intermediate areas 4 were produced in the layer 2. The intermediate areas 4 had sheet resistances $R_F$ of approximately 100$\phi$ and had thus become electrically conductive. The reduced intermediate areas 4 of the layer 2 exhibited strong optical absorption. This lattice sample, generated by heating in a reducing atmosphere, does not permit of any movement of magnetic walls through the lattice.

EXAMPLE 3

With layers having thicknesses up to approximately 2 $\mu$m, very accurately defined optically-absorbing intermediate areas 4 can be generated in the magnetic layer 2 by forming defects in the areas 4 in the layer 2 by ion implantation and then by selective reduction.

According to one embodiment, a 2 $\mu$m thick ferrimagnetic garnet layer 2 of the composition $Gd_{2.62}Bi_{0.35}Pb_{0.03}Fe_{4.70}Ga_{0.27}Pt_{0.03}O_{12}$ was first covered with a 0.5 $\mu$m thick gold absorbing layer. The absorbing layer was etched so that the single domain areas 3 to be generated in the layer 2 were still covered with the layer but the intermediate areas 4 were not masked. An arrangement of channels was thus etched in the gold layer; the channels extended down to the magnetic layer 2 and were approximately 2 to 3 $\mu$m wide (determined by the limited resolving power in the normally used positive photolacquers).

Boron ions with an ion dose $> 10^{15}$/cm$^2$ and an energy of 350 keV were then implanted in the layer 2 through the channels in the gold mask. The boron ions penetrated to depths of 0.8 $\mu$m in the above-described garnet material with an energy of 350 keV.

The masking gold layer was then removed, and the layer 2 was subjected to a reduction treatment in an $N_2/H_2$ atmosphere with 90% $N_2$ + 10% $H_2$ at a temperature of 600° C. for 1 hour. In this reduction process, the reduction occurs selectively at the areas of the magnetic layer 2 implanted with boron. The nonimplanted areas are reduced only slightly. After the reduction, accurately defined optically-absorbing, electrically conductive intermediate areas 4 were formed in the layer 2 between the desired single domain areas 3 (which strongly fixed the domain walls).

Figure 2A:
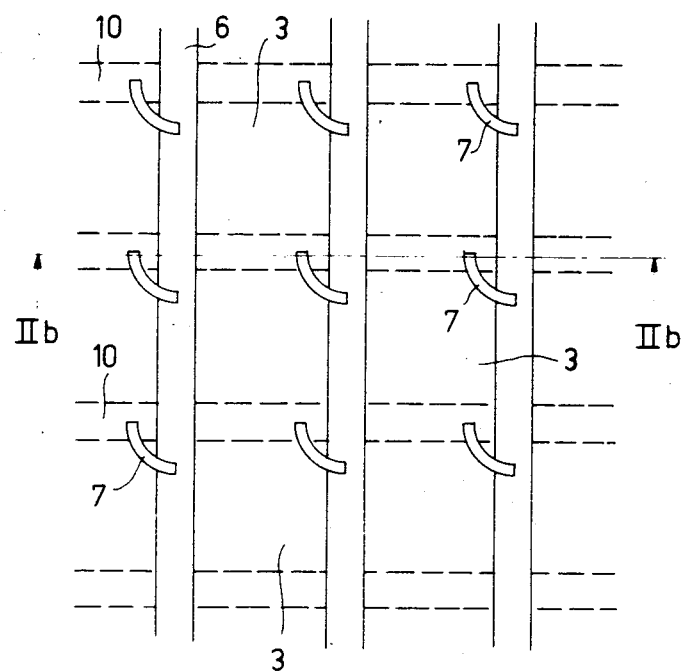
FIG. 2a is a top plan view of a second embodiment of a magnetooptical modulator.
Figure 2B:
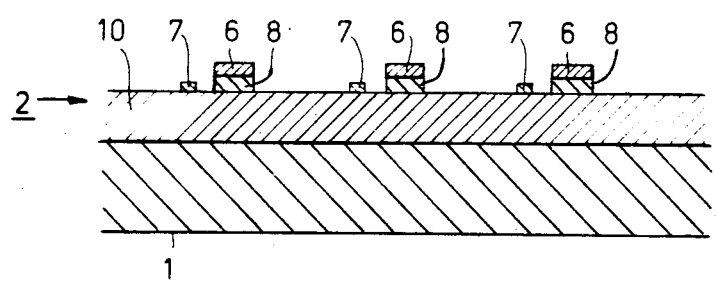

A second embodiment of a magnetooptical modulator is shown in FIGS. 2a and 2b. Corresponding parts are referred to by the same reference numerals as used in FIG. 1. The domain areas 3 are generated in the same manner as described with reference to Example 2 or Example 3, with the difference that in the reduction step the masking only exposed the shaded areas 10 to the reduction.

The reduced conductive areas 10 form a first system of conductor paths 10. A second system of conductor paths 6 is vapor-deposited on the layer 2. At the intersections between the conductors 6 and 10, the conductors are insulated from each other by insulators 8. Instead of insulators 8, the conductor 6 and 10 may also be insulated from each other by thin layers at the surfaces of conductors 10 which are converted into their original insulating condition. This may be done by temperature in oxygen with a suitable choice of the temperature and duration. A thin-film resistor 7 is again provided on each domain area 3, and is connected to a conductor 6 and a conductor 10, respectively.

Figure 3A:
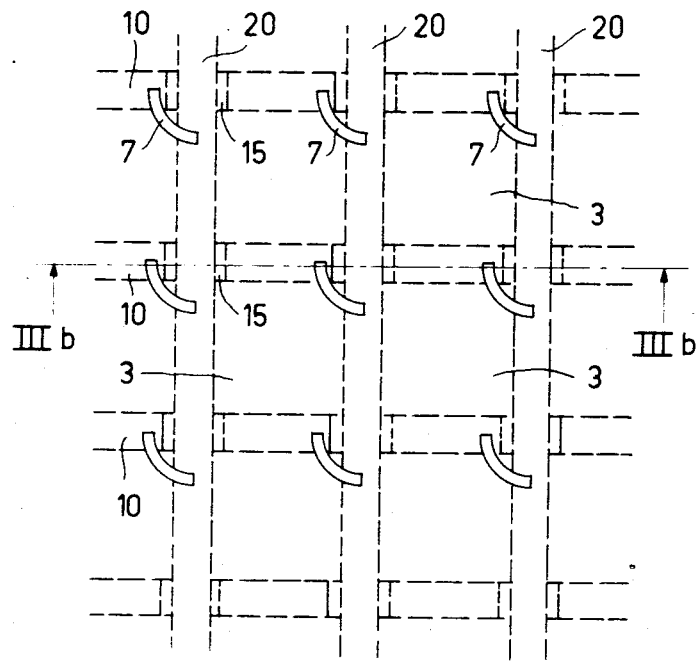
FIG. 3a is a top plan view of a third embodiment of a magnetooptical modulator.
Figure 3B:
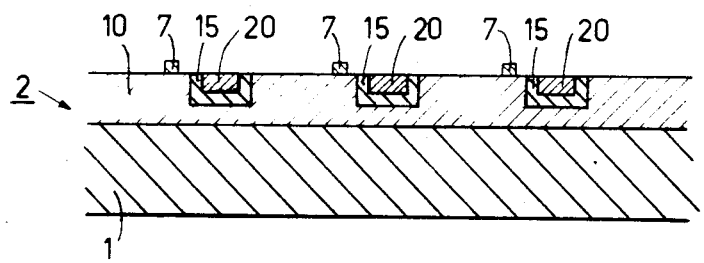

A third embodiment of a magnetooptical modulator is shown in FIGS. 3a and 3b. Corresponding parts are referred to by the same reference numerals used in FIG. 2. In this embodiment, again, conductors 10 are formed first. The areas 15 in the conductors 10 are then converted into the insulating condition by tempering in oxygen. Conductors 20 are then formed in only a part of the thickness of the layer 2. In this manner conductor paths 10 and 20 are formed in the layer 2 and are insulated from each other at their intersections.

What is claimed is:

1. A magnetooptical modulator comprising:
   a substrate; and
   a substantially planar layer of a magnetic material on the substrate, said magnetic material having an easy axis of magnetization perpendicular to the plane of the layer;
   characterized in that:
   the layer of magnetic material has a number of magnetic domain areas separated from each other by intermediate areas; and
   at least a part of at least one intermediate area is electrically conductive.

2. A magnetooptical modulator as claimed in claim 1, characterized in that the layer of magnetic material is a ferrimagnetic garnet.

3. A magnetooptical modulator as claimed in claim 2, characterized in that the garnet layer has a composition given by the formula $(Gd, Bi, Pb)_3(Fe, Al, Ga, Pt)_5O_{12}$.

4. A magnetooptical modulator as claimed in claim 3, characterized in that the garnet layer has a composition given by the formula $Gd_{2.62}Bi_{0.35}Pb_{0.03}Fe_{4.70}Ga_{0.27}Pt_{0.03}O_{12}$.

5. A magnetooptical modulator as claimed in claim 1, characterized in that:
   the electrically conductive parts of the intermediate areas form the entire first system of conductors; and
   the second system of conductors is formed on the layer.

6. A magnetooptical modulator as claimed in claim 5, characterized in that the layer of magnetic material is a ferrimagnetic garnet.

7. A magnetooptical modulator as claimed in claim 6, characterized in that the garnet layer has a composition given by the formula $(Gd, Bi, Pb)_3(Fe, Al, Ga, Pt)_5O_{12}$.

8. A magnetooptical modulator as claimed in claim 7, characterized in that the garnet layer has a composition given by the formula $Gd_{2.62}Bi_{0.35}Pb_{0.03}Fe_{4.70}Ga_{0.27}Pt_{0.03}O_{12}$.

9. A magnetooptical modulator as claimed in claim 1, characterized in that
   the electrically conductive parts of the intermediate areas form the entire first system of conductors and the entire second system of conductors.

10. A magnetooptical modulator as claimed in claim 9, characterized in that the layer of magnetic material is a ferrimagnetic garnet.

11. A magnetooptical modulator as claimed in claim 10, characterized in that the garnet layer has a composition given by the formula $(Gd, Bi, Pb)_3(Fe, Al, Ga, Pt)_5O_{12}$.

12. A magnetooptical modulator as claimed in claim 11, characterized in that the garnet layer has a composition given by the formula $Gd_{2.62}Bi_{0.35}Pb_{0.03}Fe_{4.70}Ga_{0.27}Pt_{0.03}O_{12}$.

* * * * *

UNITED STATES PATENT AND TRADEMARK OFFICE
CERTIFICATE OF CORRECTION

PATENT NO.  : 4,578,651
DATED       : March 25, 1986
INVENTOR(S) : HEINRICH HEITMANN ET AL It is certified that error appears in the above-identified patent and that said Letters Patent is hereby corrected as shown below:

In the Claims:

Delete claim 1 and insert

--1. A magnetooptical modulator comprising:

a substrate;

a substantially planar layer of magnetic material on the substrate, said magnetic material having an easy axis of magnetization perpendicular to the plane of the layer, said layer of magnetic material having a number of magnetic domain areas separated from each other by intermediate areas;

a first system of conductors on or in the layer;

a second system of conductors on or in the layer, the second system of conductors crossing the first system of conductors, said second system of conductors being

UNITED STATES PATENT AND TRADEMARK OFFICE
CERTIFICATE OF CORRECTION

PATENT NO. : 4,578,651

DATED : March 25, 1986

INVENTOR(S) : HEINRICH HEITMANN ET AL

It is certified that error appears in the above-identified patent and that said Letters Patent is hereby corrected as shown below:

electrically insulated with respect to the first system of conductors at the crossings; and a number of resistive layers, one resistive layer for each magnetic domain area, each resistive layer being connected to a conductor of the first system and to a conductor of the second system;

characterized in that at least part of at least one intermediate area is electrically conductive and forms a part of one of the systems of conductors.--

Signed and Sealed this

Twenty-ninth Day of July 1986

[SEAL]

Attest:

DONALD J. QUIGG

Attesting Officer

Commissioner of Patents and Trademarks